(12) United States Patent
Nara et al.

(10) Patent No.: US 6,239,861 B1
(45) Date of Patent: May 29, 2001

(54) EXPOSURE METHOD AND SCANNING TYPE EXPOSURE APPARATUS

(75) Inventors: Kei Nara, Yokohama; Tsuyoshi Naraki, Tokyo, both of (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/479,671

(22) Filed: Jan. 10, 2000

Related U.S. Application Data

(63) Continuation of application No. 08/970,581, filed on Nov. 14, 1997, now abandoned.

(30) Foreign Application Priority Data

Nov. 19, 1996 (JP) ....................................... 8-307599

(51) Int. Cl.⁷ ............................ G03B 24/42; G03B 27/72
(52) U.S. Cl. .................................... 355/53; 355/71
(58) Field of Search .............................. 355/53, 67–71, 355/77; 356/399–401; 250/548

(56) References Cited

U.S. PATENT DOCUMENTS

| | | | | |
|---|---|---|---|---|
| 5,168,021 | * | 12/1992 | Arai et al. ............................ | 430/22 |
| 5,272,502 | * | 12/1993 | Saiki ..................................... | 355/76 |
| 5,289,263 | * | 2/1994 | Kiyokawa et al. ................... | 356/375 |
| 5,359,389 | * | 10/1994 | Ishohata ............................... | 355/53 |
| 5,361,121 | * | 11/1994 | Hattori et al. ........................ | 355/50 |
| 5,526,093 | * | 6/1996 | Takahashi ............................. | 355/53 |
| 5,610,683 | * | 3/1997 | Takahashi ............................. | 355/53 |
| 5,668,624 | * | 9/1997 | Naraki et al. ........................ | 355/53 |
| 5,715,037 | * | 2/1998 | Saiki et al. ........................... | 355/53 |
| 5,729,331 | * | 3/1998 | Tanaka et al. ........................ | 355/53 |
| 5,825,470 | * | 10/1998 | Miyai et al. .......................... | 355/72 |

* cited by examiner

*Primary Examiner*—Russell Adams
*Assistant Examiner*—Hung Henry Nguyen
(74) *Attorney, Agent, or Firm*—Vorys, Sater, Seymour and Pease LLP

(57) ABSTRACT

A substrate coated with a photosensitive agent is exposed to light beams passing through a mask by projecting the light beams upon the substrate through a projection optical system, on which occasion areas having a large layer thickness of the photosensitive agent on the substrate are subjected to double exposures, i.e., the exposure through the projection optical system and an exposure through an optical system different therefrom.

18 Claims, 10 Drawing Sheets

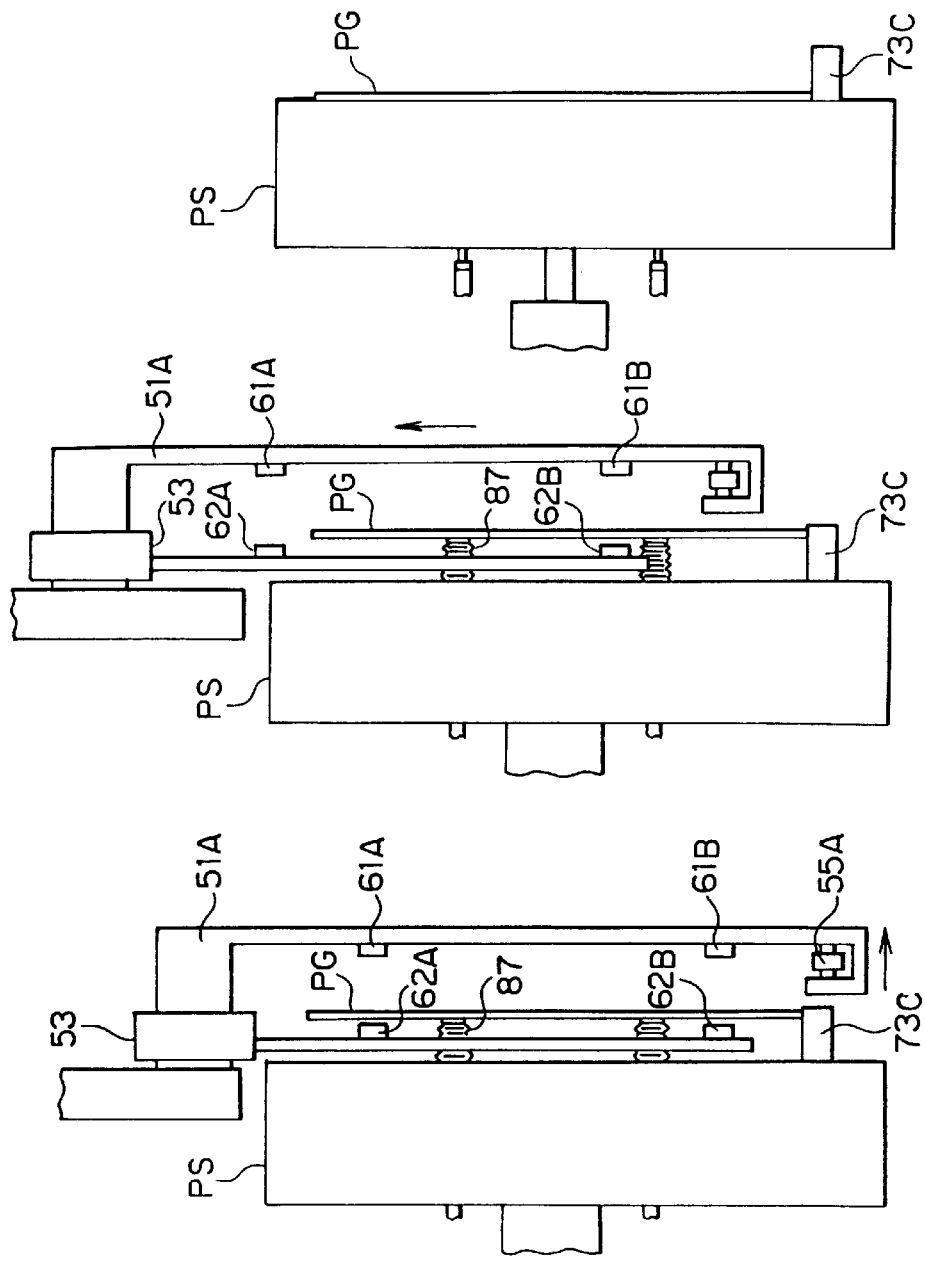

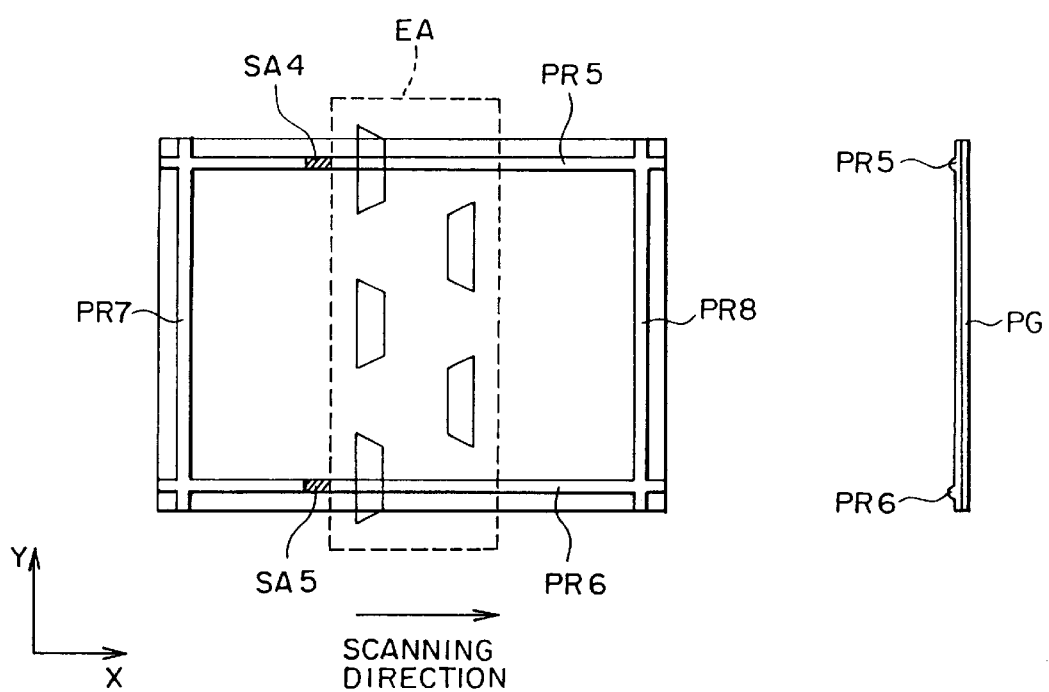

EXPOSURE METHOD AND SCANNING TYPE EXPOSURE APPARATUS

CROSS-REFERENCE TO RELATED APPLICATION

This application is a continuation of application Ser. No. 08/970,581 filed Nov. 14, 1997 (abandoned).

This application claims the benefit of Japanese Application No.8-307599, which is hereby incorporated by reference.

BACKGROUND OF THE INVENTION

1. Field of the Invention

The present invention relates to an exposure method of and a scan type exposure apparatus for exposing a substrate coated with a photosensitive agent to a mask pattern on the occasion of manufacturing a liquid crystal display device.

2. Related Background Art

In recent years, there has been frequently used a liquid crystal display panel as a display device of a word processor, a personal computer and a portable TV set etc. The liquid crystal display panel is manufactured by executing a patterning process of a transparent thin film electrode on a glass substrate in a desired configuration by photolithography. A process based on this photolithography involves the use of an exposure apparatus for projection-exposing a photosensitive agent layer such as a photoresist etc coated over the glass substrate to a circuit pattern formed on the mask. What is mainly used as the exposure apparatus is a scan type exposure apparatus for exposing the photosensitive substrate while scanning the mask and the photosensitive substrate in synchronization with respect to the projection optical system in a present situation where the liquid crystal display panel increases in its size.

The photosensitive agent such as the photoresist etc is coated over the glass substrate by use of a photosensitive agent coating device such as a spin coater and a roll coater etc. In this case, it might happen that a layer thickness of the photosensitive agent becomes large in a peripheral portion on the substrate or at the central portion on the substrate due to a characteristic etc of the photosensitive agent coating device.

A greater exposure quantity than a normal exposure quantity is required for completely exposing the area having the large layer thickness due to non-uniformity in coating of the photosensitive agent. Therefore, a separate exposure apparatus for exposing the area having the large layer thickness of the photosensitive agent due to the non-uniformity in the coating, has hitherto been installed in addition to the exposure apparatus for the pattern exposure. Providing two types of exposure apparatuses, however, presents a large problem in terms of costs and an installation space as well.

SUMMARY OF THE INVENTION

It is a primary object of the present invention, which was contrived in view of the above problems inherent in the prior art, to provide an exposure method and an exposure apparatus that are capable of double exposing an area in which an non-uniformity in coating of a photosensitive agent occurs without using a special exposure apparatus.

According to the present invention, before or after an exposure for a pattern transfer through a first illumination system, a position in which an non-uniformity in coating of a photosensitive agent occurs is partially exposed through a second illumination system.

Namely, according to the present invention, in an exposure method of exposing a substrate coated with a photosensitive agent to light beams passing through a mask by projecting the light beams thereon through a projection optical system, the improvement comprises a step of executing double exposure by exposing an area having a large layer thickness of the photosensitive agent on the substrate through the projection optical system, and by exposing through an optical system different from the projection optical system.

Further, according to the present invention, in a scan type exposure apparatus which comprises an illumination optical system for illuminating a mask, a projection optical system for projecting light beams passing through the mask onto an exposure area on a rectangular substrate coated with a photosensitive agent, and a moving device for relatively moving the mask and the substrate in synchronization in a predetermined direction with respect to the projection optical system, the improvement comprises an exposing device for exposing an area having the large layer thickness of the photosensitive agent within the exposure area.

The exposure by the exposing device can be done when relatively moving the mask and the photosensitive substrate in synchronization with respect to the projection optical system. For this purpose, it is preferable that the projection optical system and the exposing device be disposed in a direction of the relative movement (an X-direction).

The exposing device for exposing the area having the large layer thickness of the photosensitive agent is not necessarily required to expose the substrate placed on the substrate stage. For example, a possible construction is that a carrier unit for carrying the substrate to the substrate stage is provided with the exposing device, and the substrate in the process of being carried may be exposed.

Moreover, the exposing device for exposing the area having the large layer thickness of the photosensitive agent may include a control unit for controlling an exposure quantity of the exposing device in accordance with the layer thickness of the photosensitive agent.

According to the present invention, the area in which the non-uniformity in the coating of the photosensitive agent occurs is double exposed through the first illumination system and the second illumination system, and hence the photosensitive agent on the area having the large layer thickness due to the non-uniformity in the coating, can be also surely exposed. Furthermore, the second illumination system maybe provided in combination in the projection optical system for projecting a mask pattern and a substrate carriage, and no special exposure apparatus is needed for double exposing the area in which the non-uniformity in the coating of the photosensitive agent is produced, thereby causing no problem in terms of rising costs and requiring an installation space.

BRIEF DESCRIPTION OF THE DRAWINGS

Other objects and advantages of the present invention will become apparent during the following discussion in conjunction with the accompanying drawings, in which:

FIGS. 9A–9C are explanatory views each showing how the rectangular substrate is transferred to the substrate stage; and FIGS. 10A and 10B are explanatory views showing another example of the substrate on which the non-uniformity in the coating of the photosensitive agent occurs.

DESCRIPTION OF THE PREFERRED EMBODIMENTS

Figure 4:
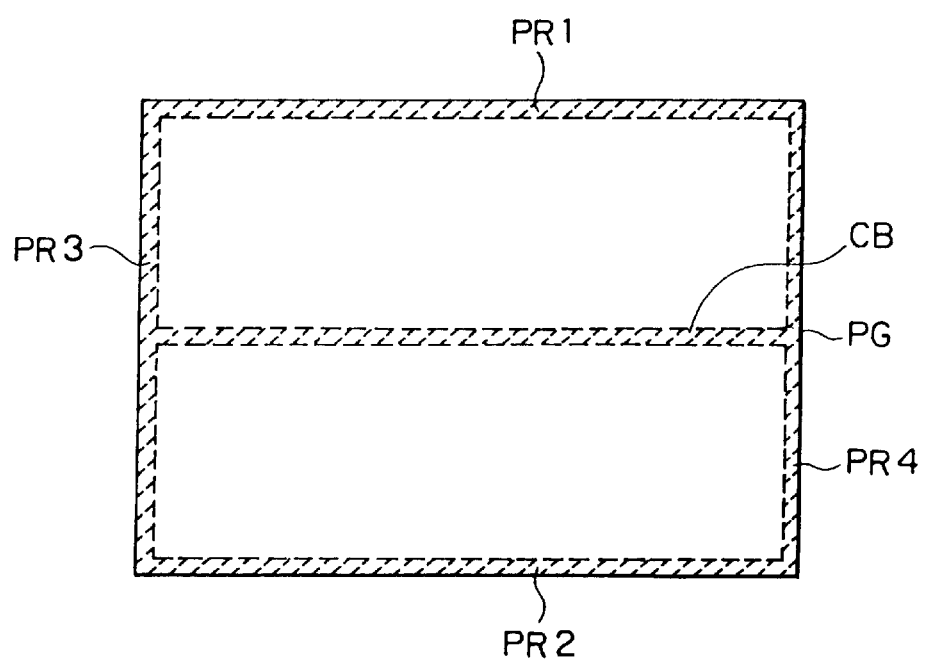
FIG. 4 is an explanatory diagram showing one example of a rectangular substrate on which an non-uniformity in coating of a photosensitive agent occurs.

Illustrative embodiments of the present invention will hereinafter be described with reference to the accompanying drawings. Herein, as illustrated in FIG. 4, it is assumed that a layer thickness of a photosensitive agent coated over a rectangular glass substrate PG is larger in peripheral strip areas PR1, PR2, PR3, PR4 of the rectangular substrate PG as well as in a strip area CB extending across the center of the substrate than in other areas. Note that a positive type photoresist, it is assumed, is coated as the photosensitive agent.

Figure 1:
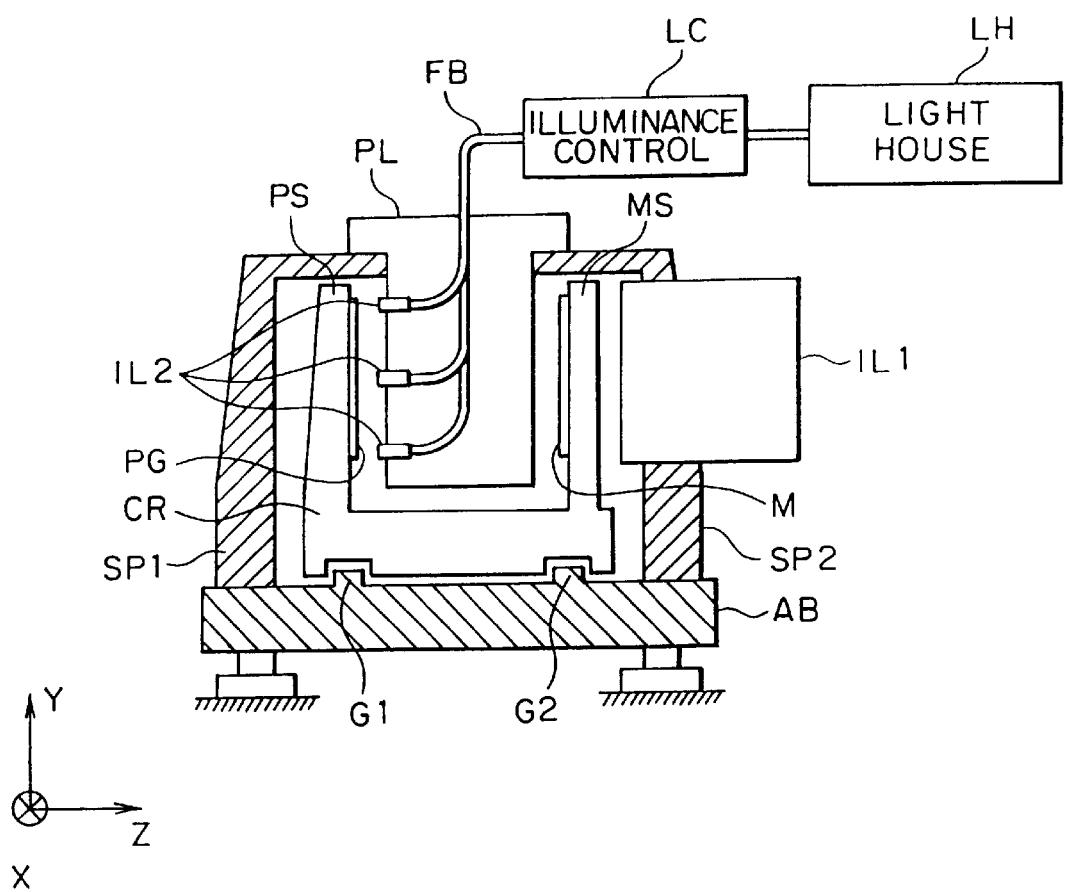
FIG. 1 is a side view schematically showing one example of a scan type exposure apparatus according to the present invention.

FIG. 1 is a schematic side view showing one example of a scan type exposure apparatus according to the present invention. Support columns SP1, SP2 extend upward from an anti-vibration table AB. A first illumination system IL1 for illuminating a mask M with an exposure light beam and a projection optical system PL for projecting a pattern image of the mask M on the rectangular substrate PG, are fixed to the support columns SP1, SP2. Further, guides G1, G2 are provided on an upper surface of the anti-vibration table AB. A carriage CR mounted on the anti-vibration table AB is movable in an X-direction perpendicular to the sheet surface in FIG. 1 by an unillustrated driving device while being guided by the guides G1, G2. The carriage CR includes two vertical support members provided with a mask stage MS and a substrate stage PS, respectively. The mask M is vertically held on the mask stage MS, and the rectangular substrate PG coated with the photosensitive agent is held vertically on the substrate stage PS. The mask M and the rectangular substrate PG mutually have an optically conjugate relationship with the projection optical system PL, and an erect normal image of an equi-magnification of the mask M is formed on-the rectangular substrate PG through the projection optical system PL.

The mask M is structured such that a glass substrate like quartz exhibiting a high transmissivity to the exposure light is formed with a pattern by use of a metal thin film (a light shielding member) of chrome etc.

Further, the rectangular substrate PG is exposed to liquid crystal display device patterns, in which case the single rectangular substrate PG might be formed with a plurality (e.g., four) of the same patterns. Then, the mask M is also formed with the plurality of same patterns. Hence, there is almost no possibility in which the pattern is formed in a position on the mask that corresponds to the strip area on the rectangular substrate PG shown in FIG. 4. Similarly, no patterns are formed in positions on the mask M that correspond to the strip areas PR1–PR4 on the rectangular substrate PG.

Furthermore, a second illumination system IL2 (an exposure unit) is provided in a position spaced a predetermined distance in a moving direction of the carriage CR from the projection optical system PL. The second illumination system IL2 executes a double exposure by irradiating, with an exposure light beam, an area having a large thickness of the photosensitive agent coated over the rectangular substrate PG due to non-uniformity in coating. The second illumination system IL2 is constructed of a light house LH, an illuminance control mechanism LC and an optical fiber FB. An illuminance of the exposure light emitted from a light source installed in the light house LH is controlled to a proper one by the illuminance control mechanism LC, and thereafter a predetermined spot on the rectangular substrate PG is irradiated with the exposure light via the optical fiber FB. Note that the light source of the second illumination system IL2 can be made common to a light source of the first illumination system IL1, in which case the light house LH is not required.

Figure 2:
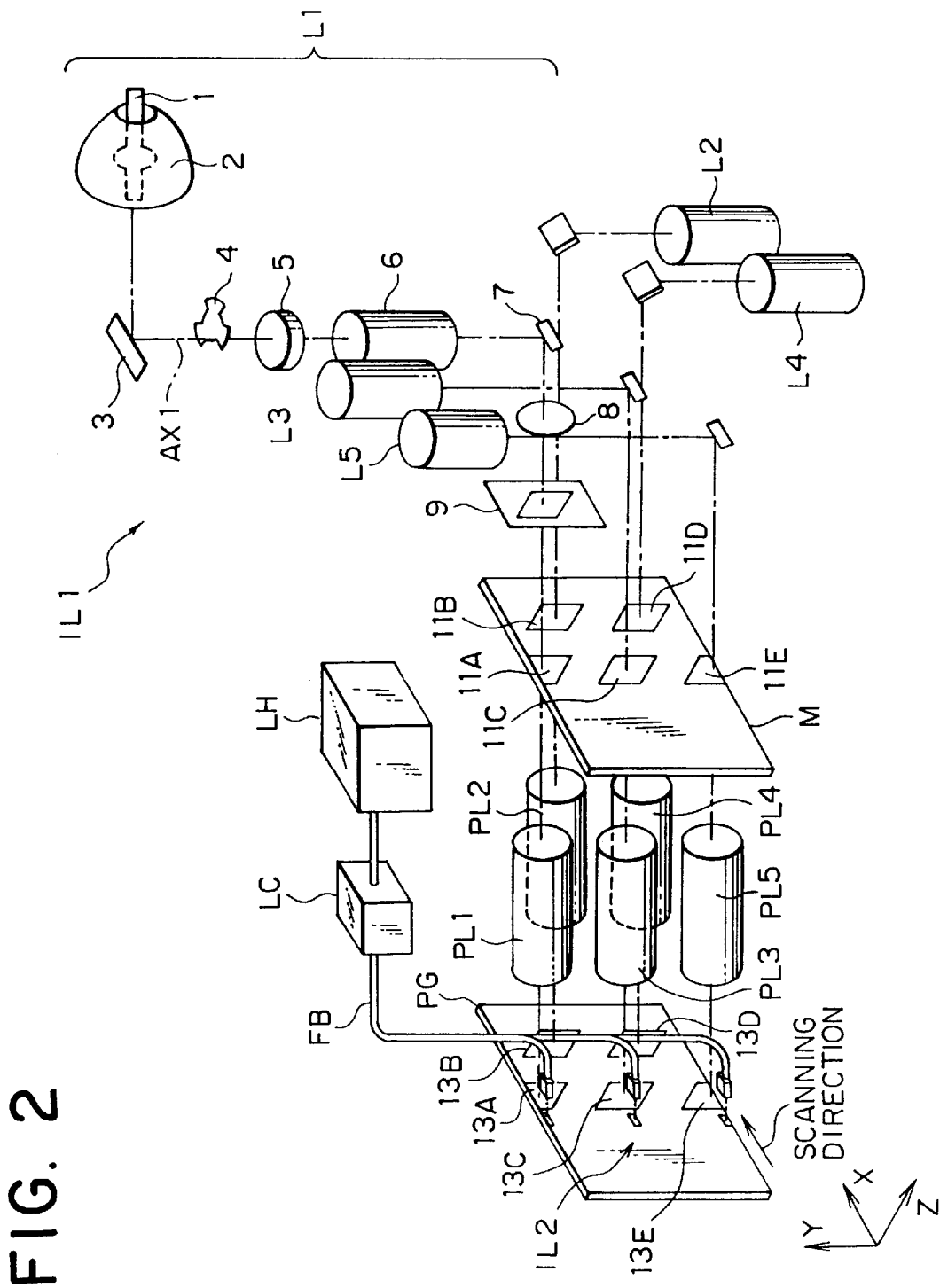
FIG. 2 is a schematic view showing a relationship between a first illumination system, a second illumination system, a mask, a projection optical system and a substrate of the scan type exposure apparatus schematically illustrated in FIG. 1.

FIG. 2 is a schematic diagram showing a relationship among the first illumination system IL1, the second illumination system IL2, the mask M, the projection optical system PL and the rectangular substrate PG in the scan type exposure apparatus schematically shown in FIG. 1.

Light beams emitted from the light source 1 such as an extra-high pressure mercury lamp etc incorporated in the first illumination system IL1, are incident upon a dichroic mirror 3 after being reflected by an elliptical mirror 2. This dichroic mirror 3 reflects the light beams having a wavelength needed for the exposure and transmits the light beams having other wavelengths. The light beams reflected by the dichroic mirror 3 are permitted or hindered by a shutter 4 from falling upon the projection optical system, which shutter is so disposed as to be movable to on- and off-axis positions of an optical axis AX1. The light beams from the light source 1 are incident on a wavelength selection filter 5 by opening the shutter 4, whereby the light beams come to have a wavelength (at least one bandwidth normally among a g-line, an h-line and an i-line) suitable for the projection optical system PL1 to conduct a transfer process.

Moreover, a Gaussian distribution is formed, wherein an intensity of the light beam is highest in the vicinity of the optical axis, and decreases as it gets close to the peripheral area. Therefore, the intensity distribution of the light beams is uniformized by a fly-eye integrator 6 and a condenser lens 8. A mirror 7 is defined as a folding mirror in order to make the optical system compact. The light beams with the uniformized intensity distribution are, after being reflected by the mirror 7, incident on a pattern surface of the mask M via a field stop 9. The field stop 9 has an aperture for restricting a projection area 13a on the rectangular substrate PG coated with the photosensitive agent.

The illumination optical system L1 for the projection optical system PL1 is constructed of elements such as the light source 1 through the field stop 9. Illumination optical systems L2–L5 having the same construction as the illumination optical system L1 are provided in this embodiment, and the light beams from the respective illumination optical systems are supplied to projection optical systems PL1–PL5, respectively. Different segmental areas (illumination areas) 11A–11E on the mask M are illuminated with the light beams emitted individually from the plurality of illumination optical systems L1–L5. The plurality of light beams passing through the mask M form pattern images of the illumination areas 11A–11E of the mask M onto different projection areas 13A–13E on the rectangular substrate PG through the projection optical systems PL1–PL5 corresponding to the illumination optical systems L1–L5. Each of the projection optical systems PL1–PL5 is classified as an erect equi-magnification real image (an erect normal image) forming optical system.

Figure 3:
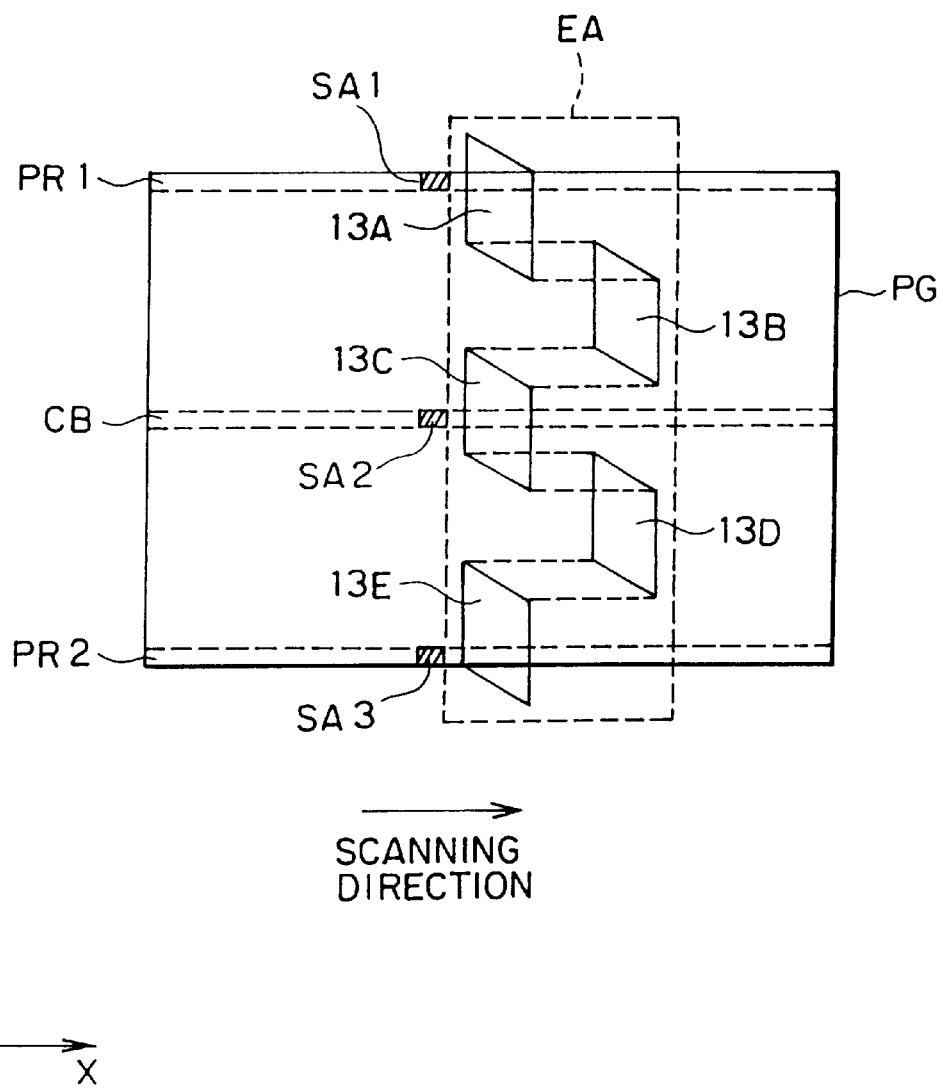
FIG. 3 is a front view of a rectangular substrate held on a substrate stage of a carriage.

FIG. 3 is a front view of the rectangular substrate PG held vertically on the substrate stage PS of the carriage CR. Formed on the rectangular substrate PG are an exposure area EA of the mask pattern through the illumination of the first illumination system IL1 and spot exposure areas SA1, SA2 through the illumination of the second illumination system IL2.

The projection areas 13A–13E through the illuminations of the first illumination system IL1 are, as illustrated in FIG. 3, disposed so that the areas adjacent to each other in a Y-direction (e.g., 13A and 13B, and 13B and 13C) are displaced by a predetermined quantity, that edges of the adjacent areas are overlapped with each other as indicated by broken lines. Hence, the plurality of projection optical systems PL1–PL5 are also disposed so as to be displaced by the predetermined quantity in the X-direction corresponding to the layout of the projection areas 13A–13E and overlapped in the Y-direction. Further, the plurality of illumination optical systems L1–L5 are disposed so that the illumination areas 11A–11E on the mask M are disposed in the same layout as that of the projection areas 13A–13E. If the above-described illumination systems and projection optical systems are used, it is feasible to provide an extension of a Y-directional width of the rectangular substrate PG by a supplement of the projection optical system, whereby an exposure width can be easily extended.

Moreover, the spot exposure areas SA1, SA2, SA3 through the illumination of the second illumination system IL2 are disposed adjacent to the exposure area EA through the first illumination system IL1 in the moving direction (a scanning direction) of the carriage CR. In an example in the Figure, the spot exposure areas SA1, SA2, SA3 are disposed in a (−)X-direction of the exposure area EA but may be disposed in a (+)X-direction of the exposure area EA.

Accordingly, an entire surface of the pattern area on the mask M can be transferred on the rectangular substrate PG by driving the carriage CR with a driving device not illustrated in FIG. 1 and scanning the mask M and the rectangular substrate PG in synchronization in the X-direction with respect to the projection optical systems PL1–PL5. At this time, the strip area PR1 at the upper edge of the rectangular substrate PG is double exposed to the projection area 13A and the spot exposure area SA1. Similarly, the strip area CB extending at the central portion of the rectangular substrate PG is double exposed to the projection area 13C and the spot exposure area SA2. The strip area PR2 at the lower edge of the rectangular substrate PG is double exposed to the projection area 23E and the spot exposure area SA3. Accordingly, the areas PR1, PR2, CB having become large in the layer thickness of the photosensitive agent due to the non-uniformity of coating of the photosensitive agent, are exposed with a greater exposure quantity than a normal exposure quantity and therefore surely sensitized.

Given next is an explanation of the double exposure of the strip areas PR3, PR4 (see FIG. 4) extending in the Y-direction orthogonal to the scanning direction (the X-direction in FIG. 3). The strip areas PR3, PR4 having the large layer thickness of the photosensitive agent, which extend in the Y-direction, are subjected to double exposures, i.e., an exposure conducted during a carrying process by second illumination systems IL3A, IL3B (exposure units) provided in a substrate carrying mechanism 20 which will be mentioned later on with reference to FIGS. 5 and 6 and serve to carry the rectangular substrate PG to the substrate stage PH within the exposure apparatus, and an exposure executed on the substrate stage PS through the projection optical system PL.

Figure 5:
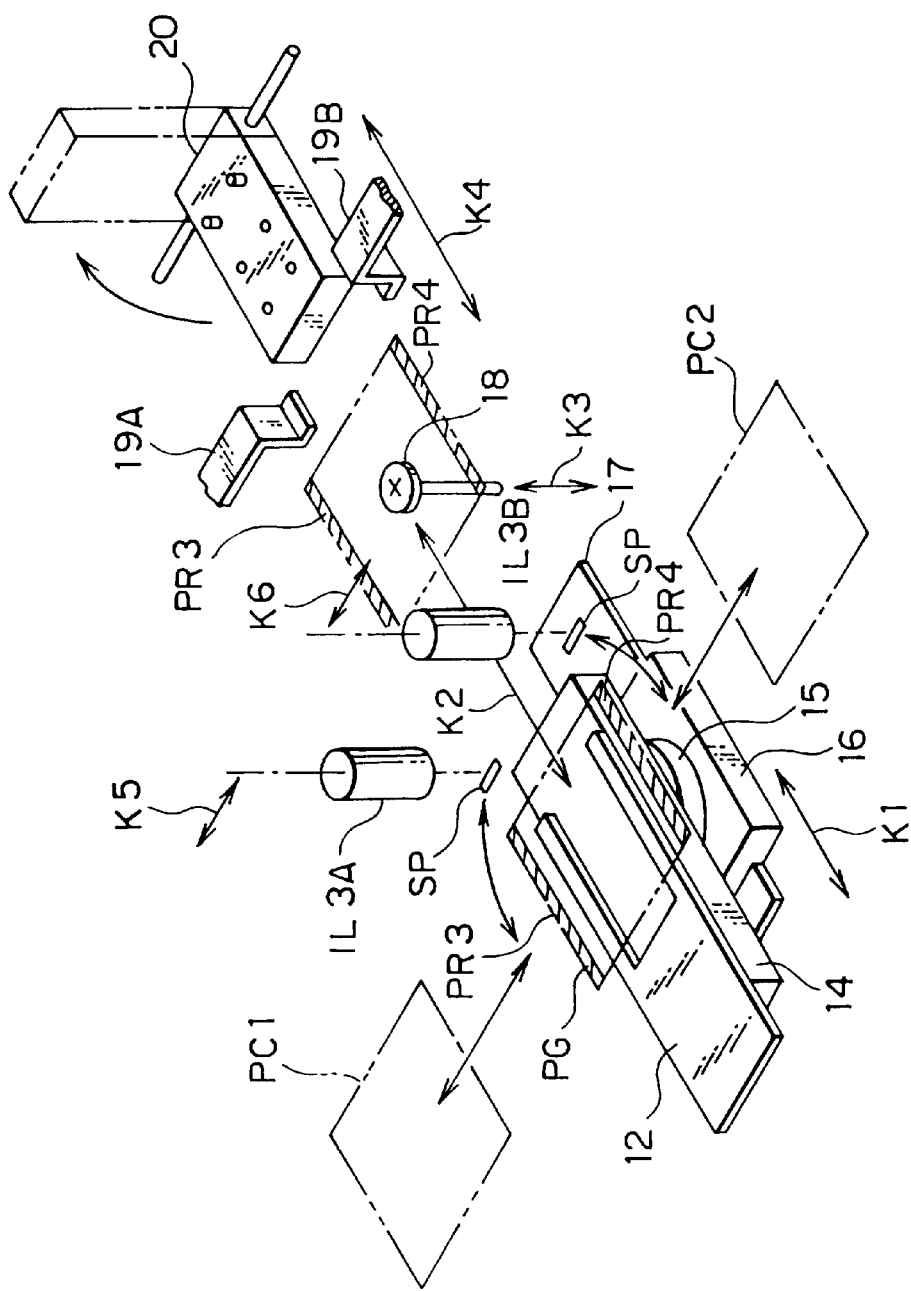
FIG. 5 is an explanatory view schematically showing a substrate carrying mechanism for carrying the rectangular substrate to the substrate stage of the carriage.
Figure 6:
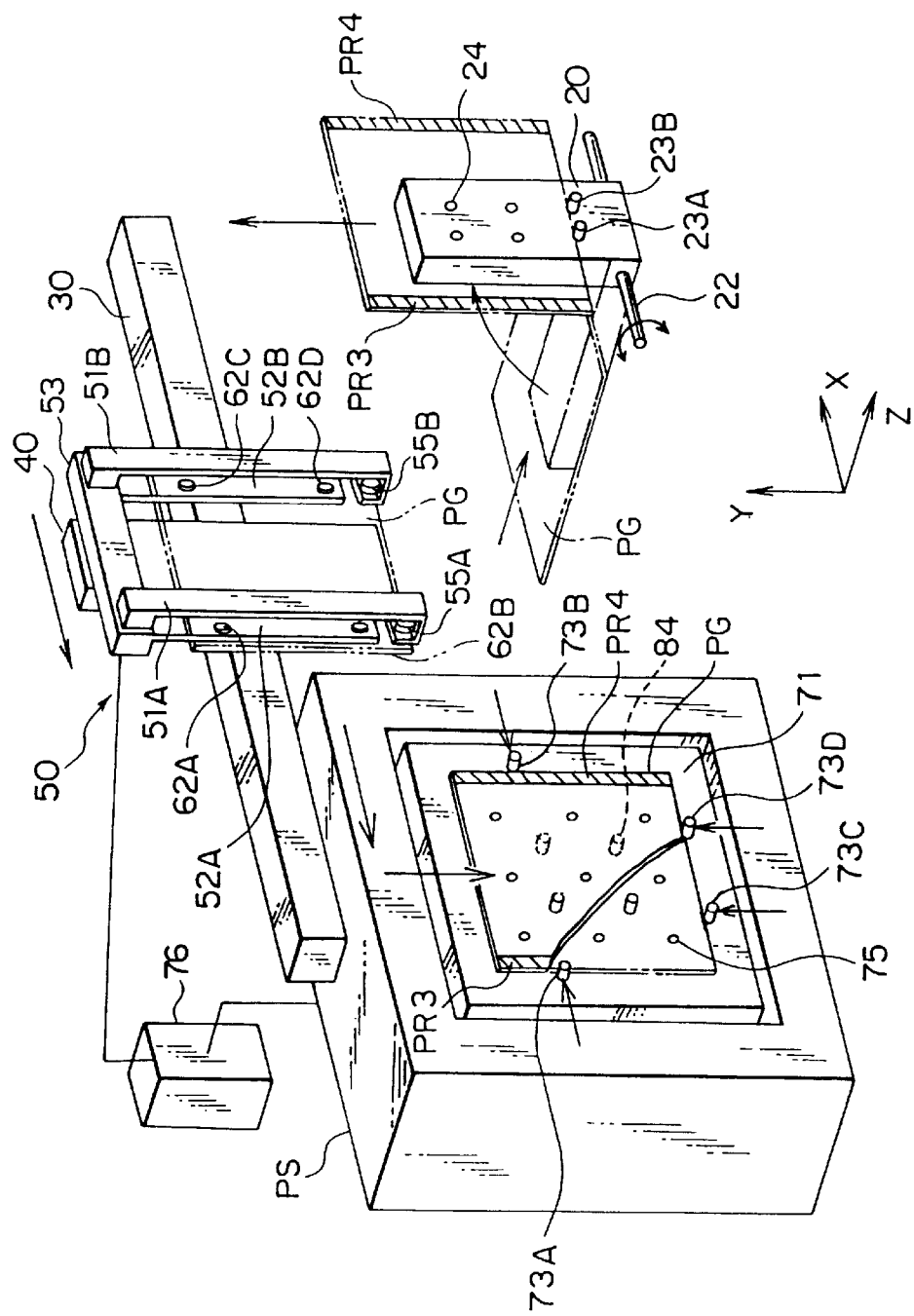
FIG. 6 is an explanatory view schematically showing the substrate carrying mechanism for carrying the rectangular substrate to the substrate stage of the carriage.

FIGS. 5 and 6 are explanatory views schematically showing the substrate carrying mechanism for carrying the rectangular substrate PG to the substrate stage PS of the carriage CR.

Referring to FIG. 5, the rectangular substrate PG composed of a glass plate the surface of which is coated with the photosensitive agent such as a resist etc, is stored in each of substrate carriers PC1, PC2. The substrate carrying mechanism includes a fork-like arm 12 for holding the underside of the rectangular substrate PG, an arm guide member 14 for one-dimensionally sliding the arm 12, a turn table 15 for rotating the arm guide member 14 through 180° at the maximum, a base moving unit 16 for one-dimensionally moving the turn table 15 in an narrowed direction K1 while being mounted with this turn table 15, and a guide member 17 for guiding the one-dimensional movement of the unit 16.

When drawing the rectangular substrate PG stored in the substrate carrier PC1, a rotational center of the turn table 15 is positioned substantially at the center of the substrate carrier PC1. Then, the turn table 15 rotates counterclockwise through just 90° from a state shown in FIG. 5, and the fork-like arm 12 is thrust out toward the carrier PC1 and becomes mounted with the rectangular substrate PG stored in a slot within the carrier PC1. Thereafter, the rectangular substrate PG within the substrate carrier PC1 is drawn out by moving the arm 12 back.

The position in which the rectangular substrate PG is held on the arm 12 in the state as illustrated in FIG. 5, is called a drawing position, and, when the arm 12 is thrust out as indicated by an arrowhead K2 from this drawing position, the rectangular substrate PG is positioned just above a center-up 18. The center-up 18 moves up and down as indicated by arrowheads K3 and thus receives the rectangular substrate PG. Further, the center-up 18 which is provided with a rotary mechanism is capable of changing a direction of the rectangular substrate PG. Slider arms 19A, 19B one-dimensionally move as indicated by arrowheads K4 and thus transfer the rectangular substrate PG on the center-up 18 to a substrate erecting mechanism 20.

In this embodiment, two spot irradiation units IL3A, IL3B constituting a part of the second illumination system are provided as local exposure units on the substrate carrying path between the drawing position shown in FIG. 5 and the center-up 18, whereby a rectangular irradiation area SP is projected spotwise onto the rectangular substrate PG by the exposure light beam. The irradiation units IL3A, IL3B are so constructed as to be independently movable in the widthwise direction of the rectangular substrate PG as indicated by arrowheads K5, K6, and an irradiation position SP can be set in a desired position on the substrate. The rectangular substrate PG is exposed by the irradiation units IL3A, IL3B as the base moving unit 16 makes the one-dimensional movement. The strip areas PRS, PR4 shown in FIG. 4 are exposed through the rectangular irradiation area SP.

Figure 7:
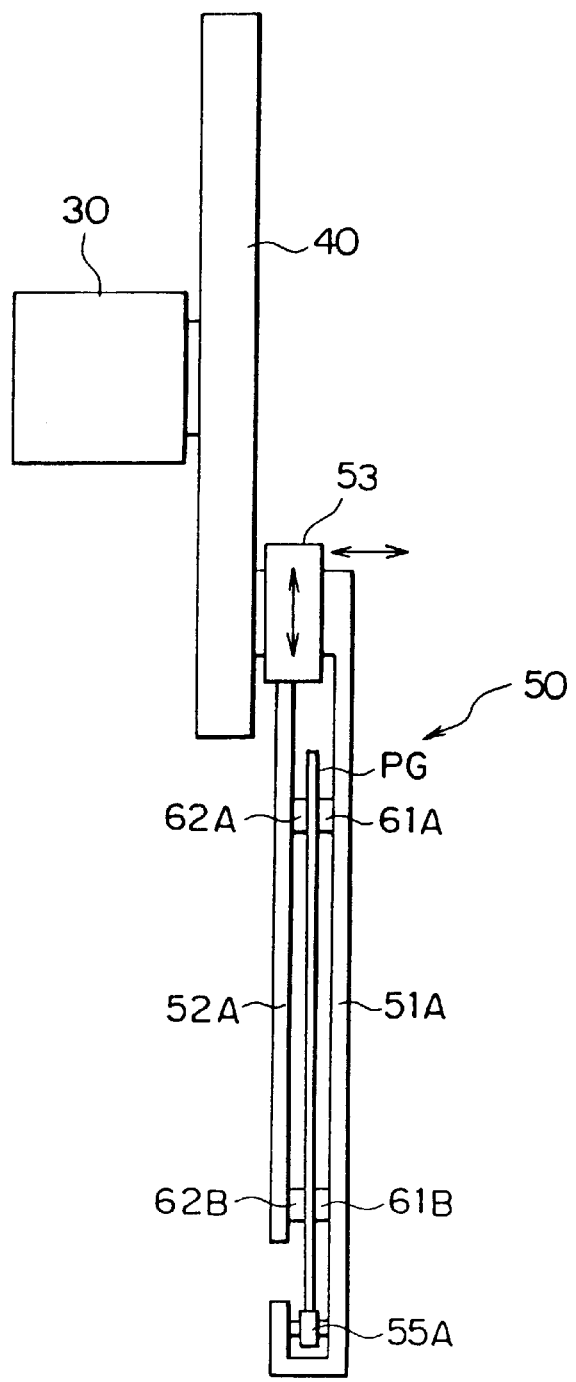
FIG. 7 is a side view showing a robot hand.

The strip areas PR3, PR4 extending the peripheral portions on the substrate, which are large in the layer thickness of the photosensitive agent due to the non-uniformity in the coating, are exposed through the spot irradiation units IL3A, IL3B, and thereafter the rectangular substrate PG held by the substrate erecting mechanism 20 is, as shown in FIG. 6, transferred by a robot hand 50 to the substrate stage PS of the carriage CR. FIG. 7 is a side view of the robot hand.

As schematically illustrated in FIG. 6, the substrate erecting mechanism 20 has substrate positioning pins 23A, 23B and vacuum suction holes 24, and is rotatable about a shaft 22. The rectangular substrate PG carried horizontally onto the substrate erecting mechanism 20 is positioned with its edge brought into contact with the pins 23A, 23B, and is sucked and held by an unillustrated vacuum pump or discharging device communicating with the vacuum suction holes 24. Thereafter, the substrate erect mechanism 20 is rotated through 90° about the shaft 22, whereby the rectangular substrate PG is erected and waits in a vertical state. The rectangular substrate PG in the vertical state is carried by the robot hand 50 to the substrate stage PS of the carriage CR.

The robot hand 50 is biaxially movable in the X- and Y-directions by an X-axis driving unit 30 movable at a long stroke in the X-direction, and by a Y-axis driving unit 40 movable in the long stroke in the Y-direction. The X-axis driving unit 30 may be constructed of a lead screw rotationally driven by, e.g., a motor, and the robot hand 50 is moved in the X-axis direction by rotating the lead screw. The Y-axis driving unit 40 works to move the arm support member 53 of the robot hand 50 in the Y-direction similarly by use of an unillustrated lead screw etc.

Four elongated of arms 51A, 51B, 52A, 52B are attached to the arm support member 53. The arms 51A, 51B suck and hold the surface of the rectangular substrate PG by use of suction pads 61A, 61B, ... (see FIG. 7) communicating with the vacuum discharging device 76. The arms 52A, 52B suck and hold the underside of the rectangular substrate PG by use of suction pads 62A, 62B, 62C, 62D. Further, the arms 51A, 51B are movable in a Z-direction by an air cylinder etc provided on the arm support member 53. The pads 61A, 61B, ... 62A, 62B, ... are composed of material exhibiting a high slidability such as Teflon etc.

The robot hand 50, when receiving the rectangular substrate PG from the substrate erecting mechanism 20, is moved toward the substrate erecting mechanism 20 by the X-axis driving unit 30. At this time, the arms 51A, 51B of the robot hand 50 are moved in a (+) Z-direction from the arm support member 53, and the robot hand 50 remains open.

The robot hand 50 having reached the upper portion of the substrate erecting mechanism 20 falls into a descent motion by the Y-axis driving unit 40, and continue to move to a height enough to receive the rectangular substrate PG. At this time, the arms 52A, 52B are positioned on the underside of the rectangular substrate PG, while the arms 51A, 51B are positioned on the surface side of the rectangular substrate PG. Thus, both surfaces of the rectangular substrate PG are seized by the arms 51A, 51B and the arms 52A, 52B. In this state, however, the lower edge of the rectangular substrate PG is not yet supported on movable rollers 55A, 55B of the arms 51A, 51B.

Next, the robot hand 50 makes its closing motion by moving the arms 51A, 51B in a (−) Z-direction. Then, the robot hand 50 is raised once by its being driven by the Y-axis driving unit 40 in a state where a gap as minute as several mm is formed between the rectangular substrate PG and each of the pads 61A, 61B, ..., 62C, 62D on the arms 51A, 51B, 52A, 52B, and the rectangular substrate PG is transferred onto the movable rollers 55A, 55B of the lower portions of the arms 51A, 51B from the substrate erecting mechanism 20. The robot hand 50 is further raised in the Y-direction by the Y-axis driving unit 40, and is, at a height of its moving completely away from the substrate erecting mechanism 20, closed by moving the arms 51A, 51B further in the (−) Z-direction. As shown in FIG. 7, the rectangular substrate PG is caught and held by the pads 61A, 61B, ... of the arms 51A, 51B and the pads 62A, 62B, ... of the arms 52A, 52B.

The robot hand 50 holding the rectangular substrate PG is moved toward the substrate stage PS by the X-axis driving unit 30. Next, the robot hand 50 is controlled in terms of its Y-directional position by the Y-axis driving unit 40 and thus arrives at a state of its reaching the transfer position adjacent to a substrate placing surface 71 of the substrate stage PS, i.e., just when the rectangular substrate PG held by the robot hand 50 comes to the position adjacent to the substrate placing surface 71 of the substrate stage PS. Thereupon, the arms 51A, 51B again make the opening motion till the minute gaps are formed between the rectangular substrate PG and each of the pads 61A, 61B, ..., 62A, 62B.

Next, movable rollers 73A, 73B, 73C, 73D on the substrate stage PS depress three sides of the rectangular substrate PG excluding an upper side thereof, whereby the rectangular substrate PG on the robot hand 50 is held on the movable rollers 73A, 73B, 73C, 73D. The movable rollers 73A–73D are movable in the Z-direction while holding the rectangular substrate PG in contact therewith.

Figure 8:
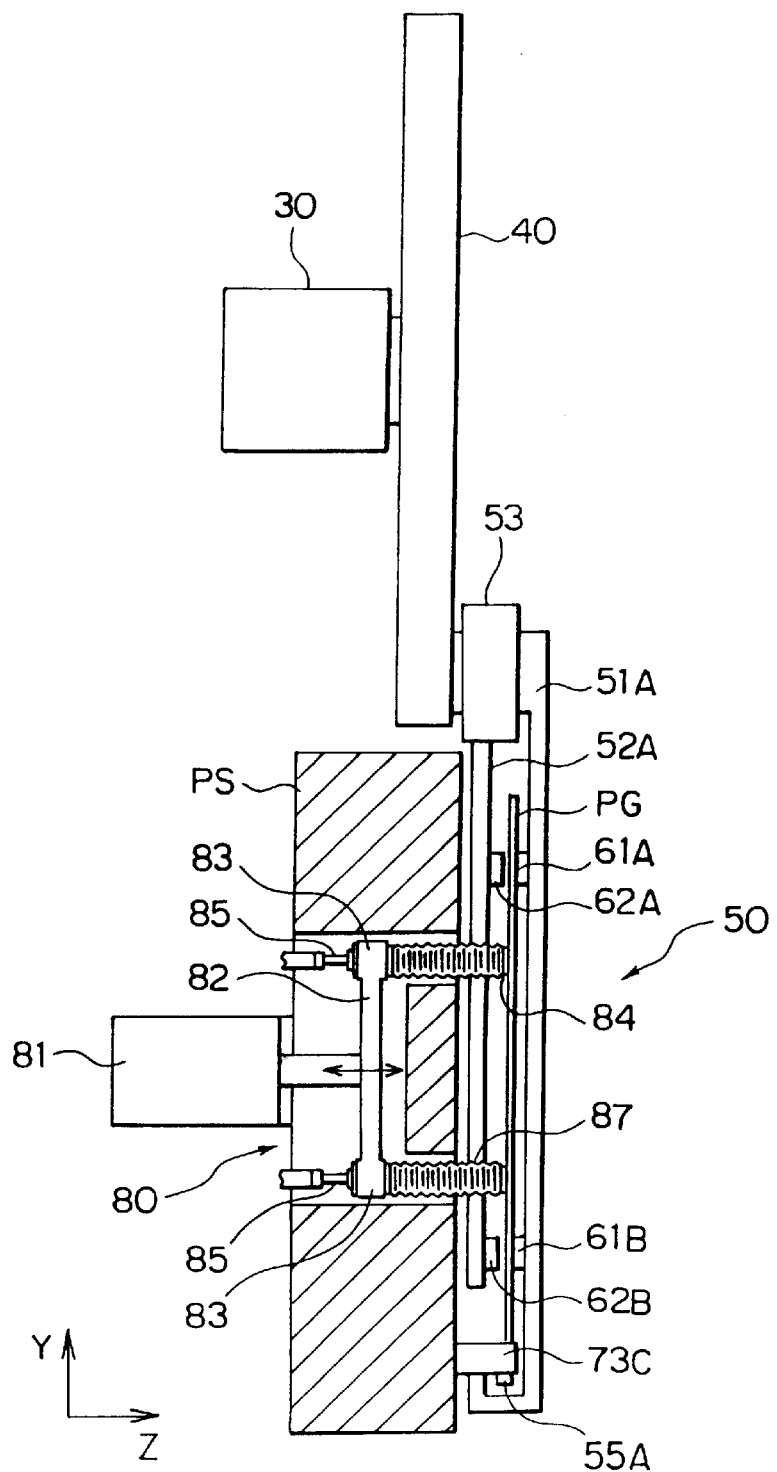
FIG. 8 is an explanatory view showing how the rectangular substrate is transferred between the robot hand and the substrate stage.

Next, as illustrated in FIG. 8, a center-up mechanism 80 protruding from the substrate placing surface of the substrate stage PS is slid in the (+) X-direction by a center-up driving device 81. Then, four suction pads 84 provided at the tip of the center-up mechanism 80 come into contact with the rectangular substrate PG, at which time the suction pads are vacuum-discharged by the vacuum discharging device, 76, whereby the rectangular substrate PG is sucked and held by the suction pads 84. The suction pads 84 provided at the tip of the center-up mechanism 80 are connected to the vacuum discharging device 76. Ball bushes 83 are attached to a drive arm 82 of the center-up driving device 81, and, more specifically, so attached as to be slidable in the Z-direction along pipes 85. Further, the suction pads 84 are fixed to the ball bushes 83 through members 87 exhibiting a spring property such as, e.g., a bellows and a spring.

Accordingly, when the drive arm 82 is driven in the Z-direction by the center-up drive device 81, this driving force is transmitted to the suction pads 84 via the members 87 exhibiting the spring property. At this time, the four suction pads 84 come into soft-contact-with the rectangular substrate PG by dint of action of the member 87 having the spring property, and it therefore never happens that the rectangular substrate PG is damaged because of being pushed too strongly when in contact therewith.

The rectangular substrate PG is sucked and held by the suction pads 84 provided at the tip of the center-up mechanism 80, at which time the arms 51A, 51B of the robot hand 50, as shown in FIG. 9A, perform the opening motion at a full stroke. Subsequently, as shown in FIG. 9B, the robot hand 50 rises in the (+) Y-direction by being driven by the Y-axis driving unit 40 and moves away from the substrate stage PS by being driven by the X-axis driving unit 30.

At a point of time when the robot hand 50 finishes moving away from the substrate stage PS, the center-up driving device 81 slides the center-up mechanism 80 in the (−) Z-direction, thereby pulling the rectangular substrate PG attracted and held by the suction pads 84 toward the substrate stage PS and bringing it into contact with the substrate placing surface 71. Thereafter, vacuum suction holes 75 formed in the substrate placing surface 71 are vacuum discharged by the vacuum discharging device 76, thereby holding, as shown in FIG. 9C, the rectangular substrate PG by the vacuum suction onto the substrate placing surface 71. When the rectangular substrate PG is held by the vacuum suction onto the substrate placing surface 71, the suction pads 84 are separated from the rectangular substrate PG by releasing the vacuum state of the suction pads 84 of the center-up mechanism 80, and are moved to a standby position by it being driven further in (−) Z-direction by the center-up driving device 81.

When the rectangular substrate PG is thus fixed to the substrate placing surface 71 of the substrate stage PS provided on the carriage CR of the exposure apparatus, as explained referring to FIG. 3, a scan exposure is conducted while moving the carriage CR, whereby the entire surface of the rectangular substrate PG is exposed to the mask pattern. At this time, the strip areas PR1, PR2, PR3 having the large layer thickness of the photosensitivity due to the non-uniformity in coating are double exposed by the scan exposure through the spot exposure areas SA1, SA2, SA3 formed by the second illumination system IL2. Accordingly, the areas PR1–PR4, CB having the large layer thickness of the photosensitive agent on the photosensitive substrate PG are given a sufficient exposure quantity owing to the double exposure in combination with the exposure of the strip areas PR3, PR4 on the rectangular substrate PG, which is effected by the irradiation units IL3A, IL3B in the process of carrying the substrate as explained in FIG. 5.

The exposed rectangular substrate PG vacuum attracted and held onto the substrate placing surface 71 of the substrate stage PS, is carried out by reversely executing the carrying operations described above. On the occasion of transferring the substrate to the substrate erecting mechanism 20, the arms 51A, 51B of the robot hand 50 make the opening motion with a minute quantity upwardly of the substrate erecting mechanism 20 in the upright position, and thereafter descend by driving the Y-axis driving unit 40, thereby transferring the rectangular substrate PG onto the substrate erecting mechanism 20. The rectangular substrate PG is sucked and held onto the substrate erecting mechanism 20 by vacuum-discharging the vacuum suction holes 24 of the substrate erecting mechanism 20, at which time the arms 51A, 51B of the robot hand 50 make the opening motion at the full stroke. Subsequently, the robot hand 50 rises and moves away therefrom through the Y-axis driving unit 40, thus terminating the transfer operation to the substrate erecting mechanism 20.

The rectangular substrate PG transferred to the substrate erecting mechanism 20 is returned to the drawing position shown in FIG. 5 through the arm 12. When the rectangular substrate PG comes to this drawing position, the rotational center of the turn table 15 is located substantially at the center of the rectangular substrate PG. Then, the turn table 15 rotates counterclockwise through, e.g., 90° from the state shown in FIG. 5, and the arm 12 is thrust toward the carrier PC1, and the exposed rectangular substrate PG is stored in the previous slot of the carrier PC1.

If the exposure quantity through the second illumination systems IL2, IL3A, IL3B is properly set corresponding to an increase in the layer thickness of the photosensitive agent due to the non-uniformity in the coating, a comparatively rough pattern such as a terminal electrode etc can be formed in an area where the non-uniformity in the coating of the photosensitive agent occurs. For example, the exposure quantity through the second illumination systems IL2, IL3A, IL3B is set to 50% of the normal exposure with respect to the area having a layer thickness of the photosensitive agent, which thickness becomes larger by 50%. In this case, the comparatively rough pattern such as the terminal electrode etc can be, though a 50% layer reduction occurs in an area having a normal layer thickness of the photosensitive agent, sufficiently formed in the areas exposed through the first illumination system IL1 and the second illumination systems IL2, IL3A, IL3B.

The terminal electrode patterns are formed using the metal thin film (the light shielding member) of chrome etc in positions on the mask M, which correspond to the strip areas PR1–PR4 on the rectangular substrate PG.

In such a case, the first illumination light beam IL1 is intercepted by the area formed with the metal thin film (light shielding member) but falls upon the rectangular substrate PG through the area formed with no metal thin film (light shielding member). Further, the exposure is conducted through the second illumination systems IL2, IL3A, ILB, and hence the sufficient exposure quantity is obtained on the rectangular substrate corresponding to the area formed with no metal thin film (light shielding member), and the terminal electrode patterns can be formed in the strip areas PR1–PR4.

FIGS. 10A and 10B are explanatory views showing another embodiment of the present invention. FIG. 10A is a front view illustrating the substrate. FIG. 10B is a sectional view of the substrate. After the rectangular substrate PG has been coated with the photosensitive agent such as the photoresist etc, the photosensitive agent along the outer peripheral portion on the substrate is exfoliated using a solvent by a device such as an edge remover. In this case, when the dissolved photosensitive agent is re-solidified, it might happen that non-uniformity in the layer thickness of the photosensitive agent due to an increased thickness thereof occurs in strip areas PR5–PR8 disposed slightly inward of the outer peripheral portion.

In such a case, the positions of the spot exposure areas SA4, SA5 through the second illumination system are set slightly inward of the outer peripheral portion in accordance with the positions of the strip areas having the large layer thickness of the photosensitive agent. In this case also, for instance, the strip areas PR7, PR8 can be exposed during the carrying process of the rectangular substrate PG, and the strip areas PR5, PR6 orthogonal thereto can be exposed on the occasion of the scan exposure of the mask pattern. All the strip areas PR5–PR8 can be thus double exposed through the simple second illumination system.

According to the present invention, the areas parallel to the scanning direction of the scan exposure among the areas having the large layer thickness of the photosensitive agent due to the non-uniformity in the coating , can be double exposed when executing the scan exposure simply by adding the simply constructed second illumination system to the exposure apparatus, while the areas perpendicular to the scan direction can be additionally exposed during the carrying process of the substrate. Accordingly, there is no necessity for preparing other exposure apparatus for double exposing the areas having the large layer thickness of the photosensitive agent.

It is apparent that, in the present invention, a wide range of different working modes can be formed based on the invention without deviating from the spirit and scope of the invention. The present invention is not restricted by its specific embodiments or working modes except being limited by the appended claims.

What is claimed is:

1. A scan type exposure apparatus comprising:

a first exposing device including an illumination optical system which is disposed adjacent to a mask for illuminating the mask, and a projection optical system positioned between said mask and a first exposure area on a rectangular substrate coated with a photosensitive agent, said projection optical system projecting light beams passing through said mask upon the first exposure area on said rectangular substrate;

a moving device disposed adjacent to said mask and said substrate, that moves said mask and said substrate in synchronization along a predetermined direction with respect to said projection optical system; and a second exposing device that exposes a second exposure area on said rectangular substrate which is positioned adjacent to the first exposure area, a predetermined distance from the first exposure area and which is smaller than the first exposure area, said first exposing device and said second exposing device both exposing said second exposure area, thereby double exposing said second exposure area.

2. The scan type exposure apparatus according to claim 1, wherein the exposure by said second exposing device is conducted during movement of the mask and the substrate with respect to said projection optical system.

3. The scan type exposure apparatus according to claim 1, wherein said projection optical system and said second exposing device are disposed at positions along said predetermined direction.

4. The scan type exposure apparatus according to claim 1, further comprising a controller that controls an exposure quantity of said second exposing device in accordance with a location of the second exposure area of the substrate.

5. The scan type exposure apparatus according to claim 1, wherein both said first exposing device and said second exposing device are used to expose a peripheral portion of said rectangular substrate to thereby effect double exposures.

6. The scan type exposure apparatus according to claim 1, wherein the second exposure area on the substrate has a band shape elongated in said predetermined direction.

7. The scan type exposure apparatus according to claim 1, wherein said second exposing device includes a light source optically connected with an adjustment mechanism that adjusts an amount of exposure light irradiated onto said second exposure area from said light source, and an optical element that guides exposure light to said rectangular substrate and regulates said second exposure area.

8. The scan type exposure apparatus according to claim 7, wherein said optical element includes an optical fiber.

9. The scan type exposure apparatus according to claim 1, wherein an adjustment mechanism of said second exposing device adjusts the illuminance of exposure light irradiated on said second exposure area in accordance with thickness of the photosensitive agent of the second exposure area.

10. The scan type exposure apparatus according to claim 1, wherein said second exposing device is disposed adjacent to said first exposing device in said moving direction thereof.

11. The scan type exposure apparatus according to claim 1, wherein said second exposing device includes a plurality of irradiating portions which expose respective portions of said second exposure area.

12. A scan type exposure apparatus comprising:

a first exposing device including an illumination optical system which is disposed adjacent to a mask for illuminating the mask, and a projection optical system positioned between said mask and a first exposure area on a rectangular substrate coated with a photosensitive agent, said projection optical system projecting light beams passing through said mask upon the first exposure area on said rectangular substrate;

a moving device disposed adjacent to said mask and said substrate, that moves said mask and said substrate in synchronization along a predetermined direction with respect to said projection optical system; and a second exposing device that exposes a second exposure area on said rectangular substrate which is positioned adjacent to the first exposure area, a predetermined distance from the first exposure area and which is smaller than the first exposure area;

wherein said substrate is placed on a substrate stage, and further comprising a third exposing device provided in a carrier that carries said substrate to said substrate stage and that exposes a third exposure area of said substrate.

13. The scan type exposure apparatus according to claim 12, wherein said second exposing device is able to adjust a position of the second exposure area.

14. The scan type exposure apparatus according to claim 12, wherein said second exposing device is able to expose a plurality of portions of said second exposure area, including at least a peripheral portion and a central portion of said rectangular substrate.

15. The scan type exposure apparatus according to claim 12, wherein said second exposing device has an adjustment mechanism which adjusts an illuminance of exposure light irradiated onto said second exposure area.

16. The scan type exposure apparatus according to claim 12, wherein said third exposure area extends in a direction perpendicular to the moving direction of said rectangular substrate.

17. The scan type exposure apparatus according to claim 12, wherein said third exposing device is so provided that an irradiating position thereof is movable in a direction perpendicular to the moving direction of said rectangular substrate.

18. The scan type exposure apparatus according to claim 12, wherein one face of said rectangular substrate is coated with said photosensitive agent, and said one face is exposed by said first, second and third exposing devices.

* * * * *